United States Patent
Horino et al.

(10) Patent No.: US 7,553,707 B2
(45) Date of Patent: Jun. 30, 2009

(54) METHOD FOR MANUFACTURING A LIQUID CRYSTAL DISPLAY DEVICE

(75) Inventors: Shigekazu Horino, Osaka (JP); Chun-hao Tung, Taoyuan (TW); Hsien-kai Tseng, Taoyuan (TW)

(73) Assignees: Quanta Display, Inc. (TW); Quanta Display Japan, Inc., Osaka (JP)

( * ) Notice: Subject to any disclaimer, the term of this patent is extended or adjusted under 35 U.S.C. 154(b) by 357 days.

(21) Appl. No.: 11/351,488

(22) Filed: Feb. 9, 2006

(65) Prior Publication Data

US 2006/0186409 A1    Aug. 24, 2006

(30) Foreign Application Priority Data

Feb. 24, 2005    (JP) .............................. 2005-048251

(51) Int. Cl.
  *H01L 21/84* (2006.01)
  *H01L 21/00* (2006.01)
(52) U.S. Cl. .................. 438/149; 438/159; 438/623
(58) Field of Classification Search ............... None
  See application file for complete search history.

(56) References Cited

U.S. PATENT DOCUMENTS

| | | | | |
|---|---|---|---|---|
| 5,841,230 A | * | 11/1998 | Ikoma et al. ............. | 313/506 |
| 6,509,614 B1 | * | 1/2003 | Shih ........................... | 257/350 |
| 6,531,392 B2 | * | 3/2003 | Song et al. ................. | 438/648 |
| 6,917,393 B2 | * | 7/2005 | Sakamoto et al. ........... | 349/43 |
| 6,947,108 B2 | * | 9/2005 | Chae ......................... | 349/113 |
| 6,972,819 B2 | * | 12/2005 | Lee et al. .................... | 349/149 |
| 6,980,268 B2 | * | 12/2005 | You ........................... | 349/113 |

FOREIGN PATENT DOCUMENTS

| | | |
|---|---|---|
| CN | 1501131 A | 6/2004 |
| JP | 2000-206571 A | 7/2002 |

OTHER PUBLICATIONS

Chinese Office Action of Mar. 23, 2007.

* cited by examiner

*Primary Examiner*—N Drew Richards
*Assistant Examiner*—Khanh B Duong
(74) *Attorney, Agent, or Firm*—Martine Penilla & Gencarella, LLP

(57) ABSTRACT

The invention provides a novel technology where a TFT array substrate for a display device is formed with three photomasks. The invention is achieved by using the novel technology in combination with a well-known four-masks process. For the novel technology, during the lithography process where a photosensitive acrylic resin film is used to make contacts, taper patterns required for general through holes are formed simultaneously with a fine pattern formed in a light shielding area that is tapered more approximately to vertical, using a photomask with phase-shift effect. Thus the pixel electrode pattern can be separated without using lithography process in subsequent processes.

5 Claims, 7 Drawing Sheets scan line—signal line  TFT          pixel           electrode
   intersection     section        section       terminal section

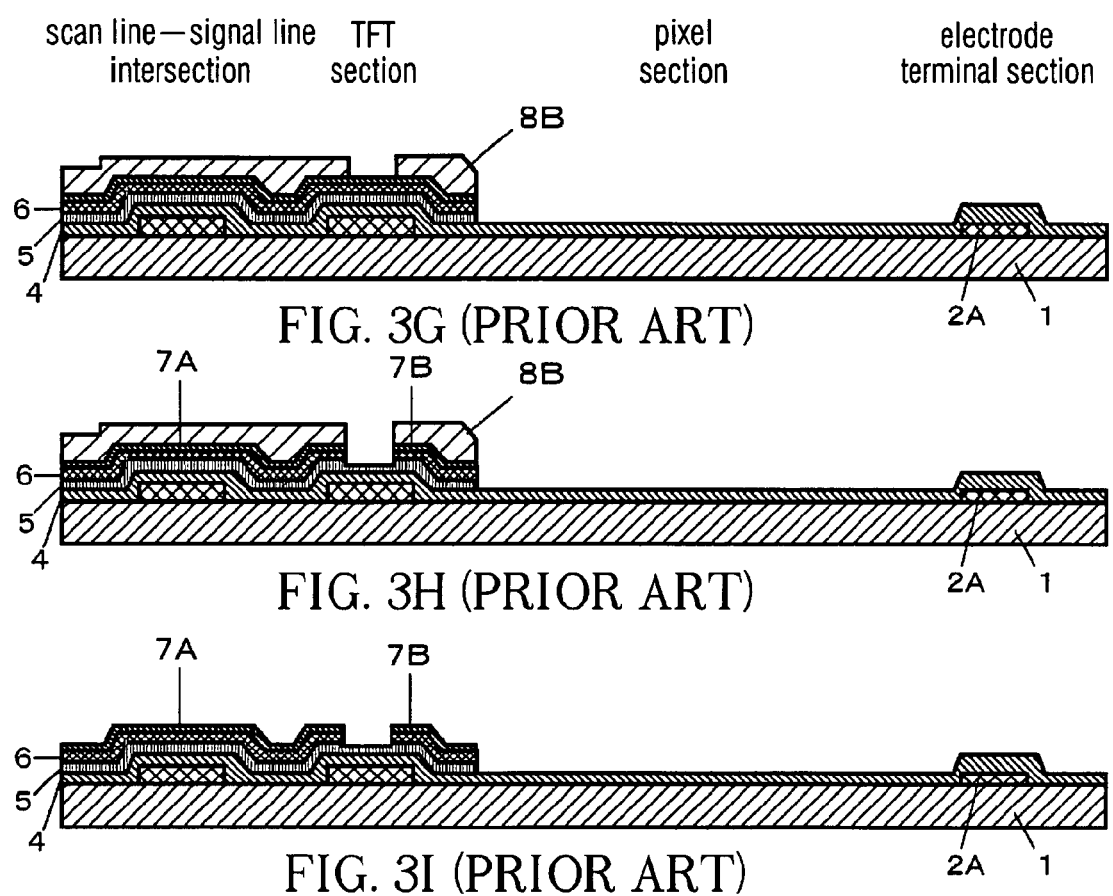

METHOD FOR MANUFACTURING A LIQUID CRYSTAL DISPLAY DEVICE

BACKGROUND OF THE INVENTION a) Field of the Invention

The invention relates to a thin film transistor (TFT) array substrate in a flat-panel display device, such as a liquid crystal display device, and a method for manufacturing the TFT array substrate.

b) Description of the Related Art

In recent years, it has been prevailing over development of substitute products for cathode ray tube (CRT) flat-panel display devices. Up until now, among other things, liquid crystal display (LCD) devices, which have been developed from the purpose of small-size mobile displays to the purpose of large-size television displays, are the most popular and widespread.

The LCD device is an electro-optical device with liquid crystals sandwiched between two pieces of substrates. An active LCD device with excellent image quality mostly uses the array substrate, in which a plurality of data lines and scan lines are formed in grids on one surface of a transparent insulation substrate such as a glass substrate, and a thin film transistor (TFT) formed with semiconductor film like amorphous silicon as a switching element is provided at each intersect of the signal line and scan line. In order to manufacture the TFT array substrate, a plurality of photolithography processes that use photomasks are necessary, just as in manufacturing semiconductor integrated circuits. It is apparent that decreasing the number of the processes which include lithography processes benefits enhancement of the LCD production and reduction of cost.

Currently, active matrix amorphous silicon TFT array substrate is generally manufactured by a process including five or four lithography processes. One conventional technology, the half-tone photoprocess technology using four photomasks disclosed in Japanese Laid-Open Patent Publication JP2000-206571 (reference 1) and "A NOVEL FOUR MASK COUNTPROCESS ARCHITECTURE FOR TFT-LCDS" SID 2000, *Digest of Technical Papers*, Page 1006-1009, will be described below. It is a rationalized technology where the island-like process of a semiconductor layer including channels and the process of the source-drain wiring are performed through the half-tone exposure technology with one photomask.

FIGS. 1A to 5O are referenced to for the description of reference 1 in correspondence with the progress of the process; FIGS. 1 to 5 illustrate sectional portions of a scan line—data line intersection at which the data lines and the scan lines are arranged to intersect, a TFT section as a switching element, a pixel section, and an electrode terminal section arranged in circuits surrounding the scan lines.

First, as shown in FIG. 1A, chromium, molybdenum, tantalum, aluminum, copper, alloy thereof, or stacked layer is covered on one surface of a glass substrate 1 as a first metal film 2 by using a film preparation device such as a sputtering device. Second, photoresist is coated on a surface of the first metal film 2 and a photoresist pattern 3 as shown in FIG. 1B is selectively formed by using a first photomask. Third, the first metal film 2 is etched to remove the photoresist with the photoresist pattern 3 as a mask, and thus a gate film 2A functioning concurrently as a scan line as shown in FIG. 1C is formed. The thickness of the gate film 2A is generally set in a range of 0.1 to 0.3 µm.

Next, three films including a first silicon nitride film 4 as a gate insulation layer, an almost impurity-free first amorphous silicon (a-Si) film 5 as channels of transistor, and a second amorphous silicon film (N+a-Si) 6 doped with N-type impurities as the source-drain of transistor are covered with respective thickness of 0.3-0.2-0.05 µm by using a film preparation device such as the plasma chemical vapor deposition (CVD) device or sputtering device. Further, chromium, molybdenum, tantalum, aluminum, copper, alloy thereof, or stacked layer is covered as a second metal film 7 by the sputtering device; the thickness of the second metal film 7 is generally around 0.3 µm. After that, a second photomask that adjusts the transmittable exposure energy with slit pattern and dot pattern, or with semi-transmitting film, is used to form an unexposed portion, a fully exposed portion, and a half-tone exposed portion, so as to prepare a photoresist pattern 8 with a thickness varied according to the region, as shown in FIG. 2E. In FIG. 2E, the part denoted as 8A indicates the channel section patterned by half-tone exposure method, which is characterized by the smaller thickness of the channel section 8A than other regions corresponding to the source-drain wiring. Then, as shown in FIG. 2F, the second metal film 7, the second silicon film 6 and the first silicon film 5 are etched by using the photoresist pattern 8 as a mask to form the source-drain wiring and expose the gate insulation layer 4A. Next, by using the oxygen plasma ashing method, the photoresist in the channel section 8A is removed and the data line layer 7 is exposed, as shown in FIG. 3G. The photoresist pattern 8B with reduced thickness is then used as a mask to again etch the data line layer 7, the second silicon film 6, and the first silicon film 5, then the second silicon film 6 between the source-drain wiring is removed so that the thickness of the first silicon film 5 remains around 0.05-0.1 µm, as shown in FIG. 3H. In other words, the almost impurity-free first silicon film is selectively formed to be the channels of TFT, and concurrently the source-drain wiring (SD wiring) 7A, 7B are separated. Thereafter, the photoresist pattern 8B is removed as shown in FIG. 3I.

Then, as shown in FIG. 4J, a protection film or a passivation layer 9 like a second silicon nitride film with a thickness of 0.3 µm, is covered by sputtering or CVD, and a photosensitive acrylic resin film 10 is further coated as a planarization film for flattening the surface of the array substrate 1. In general, the planarization film is coated to have a thickness of more than 3 µm. After that, as shown in FIG. 4K, through holes 10A, 10B for reaching the first metal film 2A and the second metal film 7B are formed with a fourth photomask. Subsequently, as shown in FIG. 4L, the insulation films in the through holes 10A, 10B, which are the second silicon nitride film 9 and the first silicon nitride film 4, are etched so that the first metal film 2A and the second metal film 7B are partially exposed.

Next, as shown in FIG. 5M, a transparent conductive film 11 is covered to be formed on the whole surface of the glass substrate 1 by such as sputtering or coating method. The transparent conductive film 11 is generally a metal oxide film like indium tin oxide (ITO), indium zinc oxide (IZO) or mixture thereof. Then, a pixel electrode 11A is patterned via selectively etching the transparent conductive film 11 by using a fifth photomask with a photoresist pattern 12 shown in FIG. 5N as a mask. Afterward, the unwanted photoresist pattern 12 is removed and the glass substrate 1 becomes an array substrate for an active matrix a-Si TFT, as shown in FIG. 5O.

The TFT array substrate thus obtained is bonded with a color filter to form a liquid crystal panel, and then backlight and driving circuit board are assembled as a liquid crystal module, so as to construct various liquid crystal display devices. The aforementioned method for manufacturing an array substrate of the active matrix a-Si TFT requires four photomasks. However, a process reduction technology disclosed in Japanese Laid-Open Patent Publication JP2002-250935 (reference 2) creates the contact formation process as shown in FIG. 4 and the pixel electrode formation process as shown in FIG. 5 by water-repellent treatment technology with one photomask, wherein three photomasks are employed in total to form a TFT array substrate. In addition, similarly, another process reduction technology disclosed in Japanese Laid-Open Patent Publication JP2002-98996 (reference 3) also creates two aforementioned patterning processes by chemical mechanical polishing treatment with one photomask, wherein three photomasks are employed in total to form a TFT array substrate.

PROBLEMS TO BE SOLVED BY THE INVENTION

As described above, five or four photomasks are required to prepare an array substrate of an active matrix a-Si TFT, which results in prolonged lead time or decreased yield for the process. Moreover, even though the number of photomasks required by the prior art disclosed in reference 2 is reduced to three, it is necessary to perform the processes of water-repellent treatment and removal of water-repellence additionally, which results in a decreased production rate. Besides, since the planarization film as the bottom layer of the pixel electrode 11A is exposed to half-tone process, the flatness of the surface of the array substrate 1 is damaged, which results in a high possibility of deteriorated display performance such as low contrast. Also, the prior art disclosed in reference 3 requires an additional process for chemical mechanical polishing treatment, and it is hard to maintain the flatness of the glass substrate for the polishing process of large-area glass substrates with the dimension longer than 1 m. Similar to reference 2, the half-tone process affects the display performance badly in reference 3.

BRIEF SUMMARY OF THE IVNENTION

Solving Problems

An object of the invention is to provide a liquid crystal display device that is manufactured with less masks and shorter lead time.

The invention discloses a liquid crystal display device, which includes a first transparent substrate with a light shielding area, a second transparent substrate or a color filter that faces the first transparent substrate, and a liquid crystal layer therein between. A plurality of unit pixels arranged in a two-dimensional array are provided on a surface of the first transparent substrate, and each unit pixel at least includes an insulated gate-type transistor, a scan line functioning concurrently as the gate of the insulated gate-type transistor, a data line functioning concurrently as the source wiring of the insulated gate-type transistor, and a pixel electrode coupled to the drain wiring of the insulated gate-type transistor. Moreover, in the liquid crystal display device, the scan line, the insulated gate-type transistor, and the data line are formed on a surface of the first transparent substrate, wherein the scan line and the data line are respectively coupled to a gate electrode and a source electrode of the transistor; a passivation layer is formed over the first transparent substrate; an organic layer including a through hole and a plurality of narrow-width trenches is formed on the passivation layer, wherein the through hole extends to the bottom of the passivation layer and the trenches that do not reach the bottom of the organic layer are formed in an area outside a pixel electrode formation region, and the organic film can be a photosensitive organic insulation layer; and a conductive film to be the pixel electrode is formed on the organic layer, wherein the pixel electrode is electrically connected to a drain electrode of the transistor via the through hole.

According to the structure, owing to the narrow-width trenches that are provided in the area outside the pixel electrode formation region and do not reach the bottom of the organic layer, the conductive film formed on the organic layer is physically and electrically insulated and separated, automatically forming individual transparent conductive films. In other words, the same effect of pixel patterning can be acquired as in the case of using superfine processing technology of photosensitive resin pattern. Any type of the conductive film can be selected, as long as the conductive film can be easily separated and insulated physically and electrically. For example, as the conductive film, selecting a transparent conductive film will obtain a transmission-type LCD device, while selecting a metal film with high reflectivity will obtain a reflection-type LCD device.

The invention also discloses a method for manufacturing the LCD device. The method for manufacturing LCD device includes: providing a first transparent substrate with a light shielding area; providing a second transparent substrate; forming a liquid crystal layer between the first transparent substrate and the second transparent substrate. The step of providing the first transparent substrate further includes: forming a scan line, a data line, and a transistor on the first transparent substrate, wherein the scan line and the data line are respectively coupled to a gate electrodes and a source electrode of the transistor; forming a passivation layer over the first transparent substrate; forming an organic layer on the passivation layer, wherein the organic layer has a through hole extending to the bottom of the passivation layer and a plurality of trenches corresponding to the light shielding area, the organic layer can be a photosensitive organic insulation film; and forming a pixel electrode on the organic layer, wherein the pixel electrode is electrically connected to a drain electrode of the transistor via the through hole. On a main surface of the first transparent substrate, a plurality of unit pixels are provided and arranged in a two-dimensional array, wherein each unit pixel at least includes at least an insulated gate-type transistor, a scan line functioning concurrently as the gate of the insulated gate-type transistor, a data line functioning concurrently as the source wiring of the insulated gate-type transistor, and a pixel electrode coupled to the drain wiring of the insulated gate-type transistor. In the method for manufacturing the LCD device, a through hole formation process at least includes the steps of: coating a photosensitive organic insulation film to form a planarization film; exposing and developing the aforesaid photosensitive organic insulation film by using a phase-shift photomask which is set to make the through hole formation region white, a pixel electrode formation region black, and periphery of the pixel electrode middle tone, wherein irradiation light from a light source shifts its phase when passing through the middle tone region; forming the photosensitive organic insulation film to include an opening for coupling to a transparent conductive film that will be formed in next step and the lower metal layer, a pixel electrode formation region, and an area outside the pixel electrode formation region, which is composed of a plurality of narrow-width trenches that do not reach the bottom of the photosensitive organic insulation film, the plurality of narrow-width trenches being used to separate adjacent pixel electrodes from one another; and covering the conductive film for the pixel electrode.

According to this structure, through the phase-shift effect in the half-tone region, the taper angle of sectional photosensitive organic insulation film of the region is close to 90 degrees, and fine lines and space above the resolution limit of the exposure machine can also be patterned, so more trenches can be formed by taking advantage of the limited area in the periphery of pixels. Moreover, the energy of exposure for irradiating the area of the fine line and space above the resolution limit of the exposure machine decreases, so the bottom surface of the patterned space (trench) does not reach the bottom of the photosensitive organic insulation film. On the other hand, the through hole formation region is patterned according to the same principle as used in the transparent part of general binary masks, thus more stable taper angle required by the through holes can be formed. The pixel electrode formation region is not patterned, so as the shielding part of general binary masks. After the given opening and slit trenches are formed, if the conductive film constituting the pixel electrode is covered, in the periphery region of the pixel electrode patterned by using phase-shift effect, the conductive film is cut off by using the pattern shape (trench) formed by the photosensitive organic insulation film to form an isolated pixel electrode formation region as the pixel electrode. In addition, because the patterning below resolution can be realized by using the phase-shift effect, a plurality of trenches can be formed in a limited area and the cut-off precision is easily enhanced. Therefore, the through holes are formed and the pixel electrode is patterned during one lithography process by using the phase-shift mask, which differs from conventional manufacturing methods, so the photolithography process is not required for the pixel electrode formation process.

According to the method for manufacturing the LCD device of the invention, the transparent conductive film for the pixel electrode can be formed by the conventional sputtering method.

According to the method for manufacturing the LCD device of the invention, the transparent conductive film for the pixel electrode can be formed by coating method without any vacuum device.

According to the method for manufacturing the LCD device of the invention, a metal film with high reflectivity for the pixel electrode can be formed by conventional sputtering method.

EFFECT OF THE INVENTION

As aforementioned, in the through hole formation process including a photosensitive acrylic resin film, a tapered opening pattern necessary for the formation of a general through hole is formed simultaneously with a trench pattern tapered more approximately to vertically by using the phase-shift mask in one lithography process. The conductive layer to be formed in next step can be separated and patterned without any lithography process during the pixel electrode formation process. A new array substrate for an LCD device is provided, wherein the pixel electrode is separated by using the grading difference of slit and deep trenches formed on a planarization film (i.e. the photosensitive acrylic resin film).

Since one process among the lithography process can be eliminated during the manufacturing of an array substrate for LCD according to the invention, the three-masks process is realized by combining the well-known four-masks process with the invention, which is a great contribution to the reduction of manufacturing cost. Furthermore, the technology of the invention can also be applied in reflection-type LCD devices.

According to the invention, the conductive film for the pixel electrode can be formed by sputtering method as used in conventional examples. Alternatively, coating method, which doesn't require expensive vacuum devices such as sputtering devices or production equipment, can also be used to form the conductive film for the pixel electrode, and thus the manufacturing cost can be further reduced.

The invention is excellent in that not only one photomask is provided to perform the through hole formation process and the pixel electrode formation process as shown in FIGS. 4 and 5, but also the process lead time is shorter and the production is higher because any additional process like those disclosed in the aforementioned prior art are not needed. Moreover, the flatness of the array substrate is not damaged and the display performance such as contrast is not deteriorated since the half-tone process is not used in the pixel electrode formation region.

BRIEF DESCRIPTION OF DRAWINGS

FIGS. 3G, 3H, and 3I each illustrates a sectional view of an array substrate for LCD according to the invention and the conventional art (semiconductor layer formation process).

DETAILED DESCRIPTION OF THE INVENTION

The manufacturing processes in FIGS. 1A to 4J are the same as those described in conventional examples. Subsequently, a sectional view of the process according to an embodiment of the invention is illustrated in FIG. 6. In addition, FIG. 7 illustrates a schematic sectional view of a phase-shift mask for describing the phase-shift mask in detail. The sectional view of the process, as mentioned above, illustrates the sectional portions of a scan line-data line intersection at which the scan lines and the data lines are shown to be arranged to intersect, a thin film transistor (TFT) section acted as a switching element, and an electrode terminal section provided in circuits surrounding a pixel section and scan lines.

First Embodiment

Figure 1A:
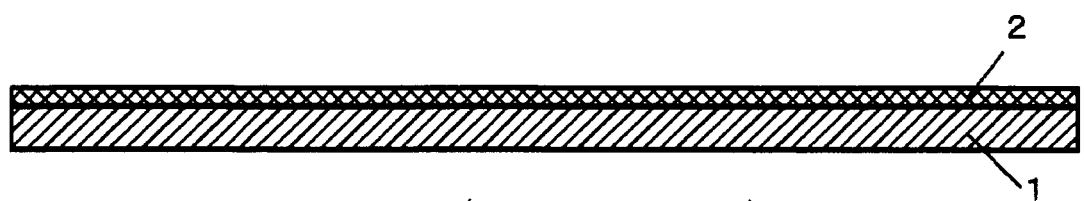
FIGS. 1A, 1B, and 1C each illustrates a sectional view of an array substrate for LCD according to the invention and the conventional art (gate formation process).
Figure 1B:
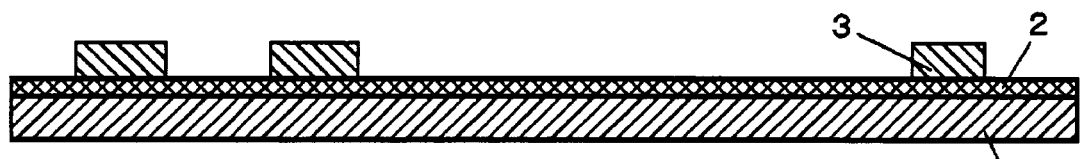
Figure 1C:

First, as shown in FIG. 1A, chromium, molybdenum, tantalum, aluminum, copper, alloy thereof, or stacked layer thereof is formed as a first metal film 2 on a surface of a glass substrate 1 by using a film preparation device such as a sputtering device. Next, photoresist is coated on one surface of the first metal film 2 and a photoresist pattern 3 as shown in FIG. 1B is formed with a first photomask. Then, the first metal film 2 is etched with the photoresist 3 as a mask, followed by removing the photoresist 3 to form a gate film 2A as shown in FIG. 1C.

Figure 2D:
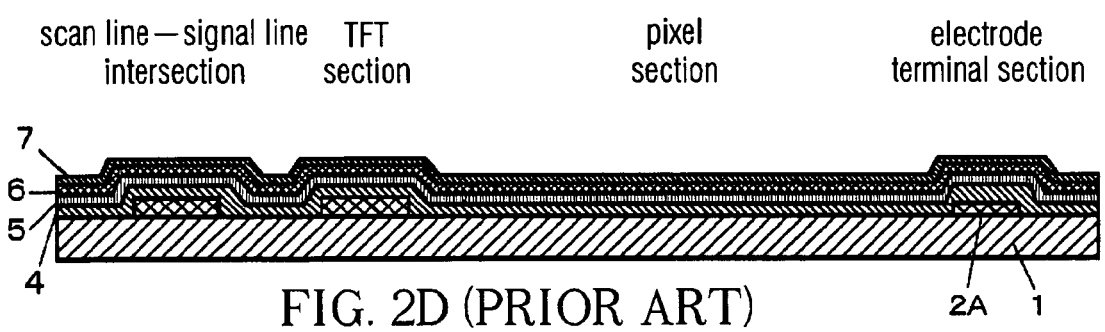
FIGS. 2D, 2E, and 2F each illustrates a sectional view of an array substrate for LCD according to the invention and the conventional art (SD wiring formation process).
Figure 2E:
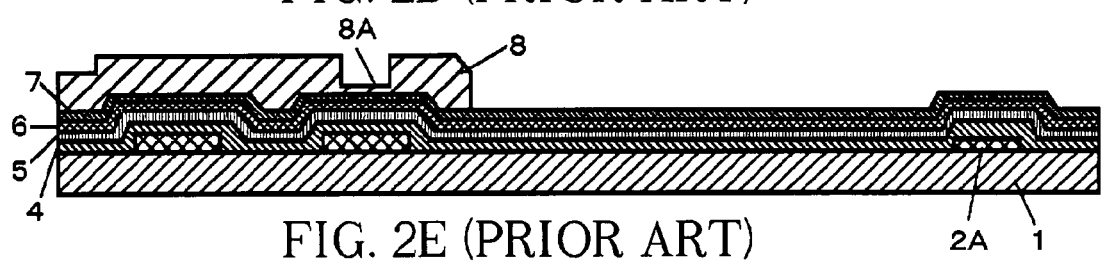
Figure 2F:
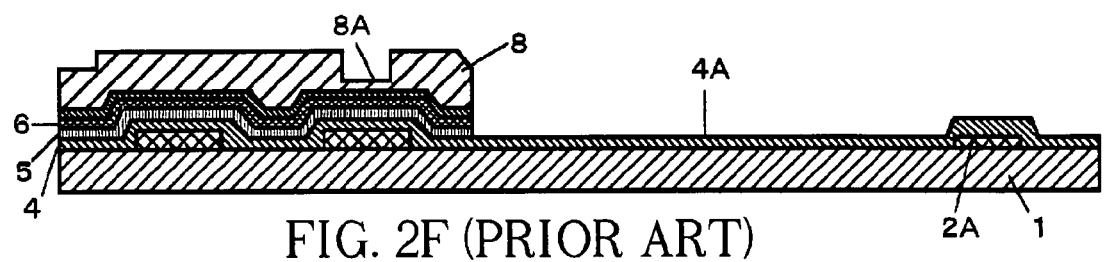
Figure 4J:
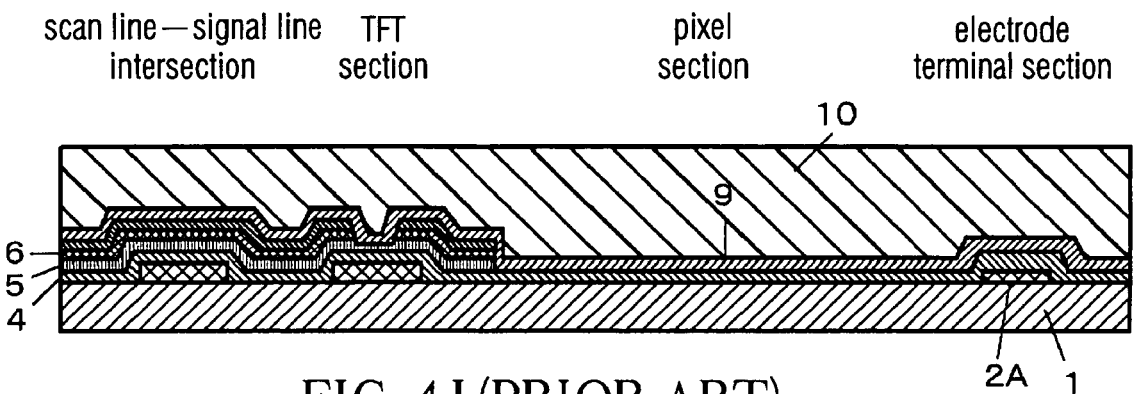
FIGS. 4J, 4K, and 4L each illustrates a sectional view of an array substrate for LCD according to the conventional art (contact formation process).
Figure 4K:
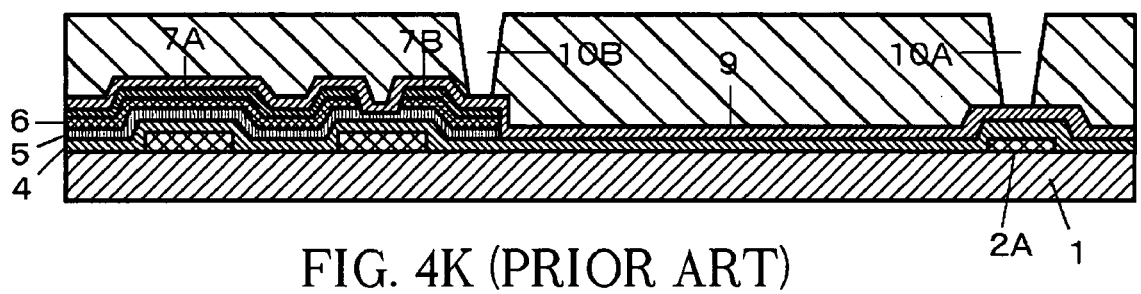
Figure 4L:
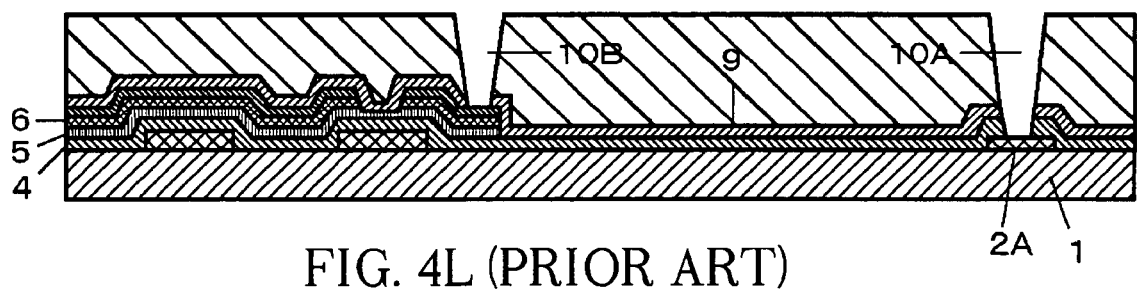
Figure 5M:
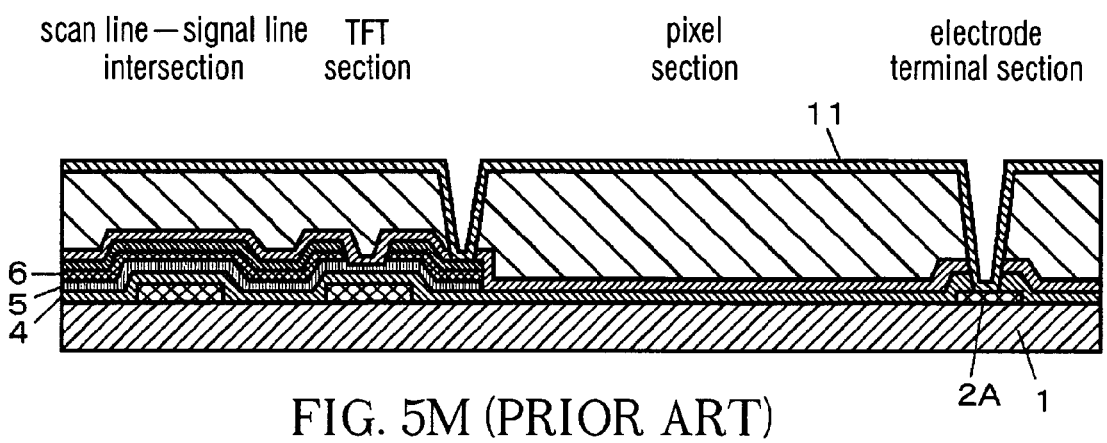
FIGS. 5M, 5N, and 5O each illustrates a sectional view of an array substrate for LCD according to the conventional art (pixel electrode formation process).
Figure 5N:
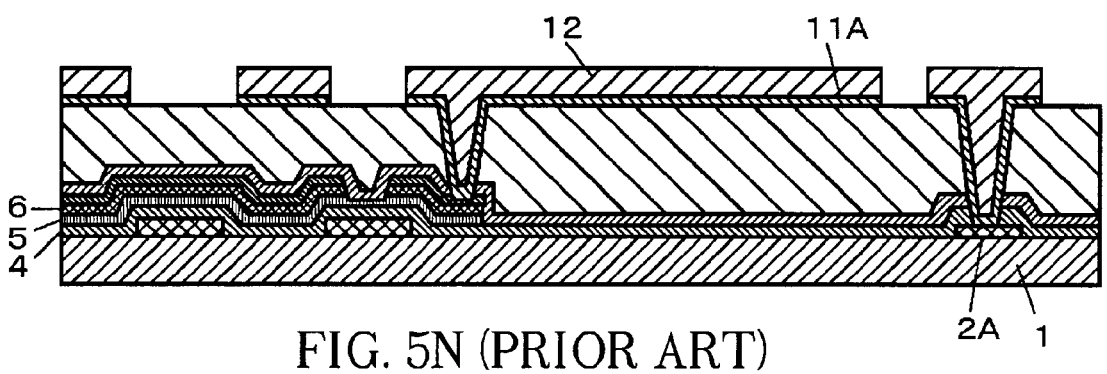
Figure 5O:
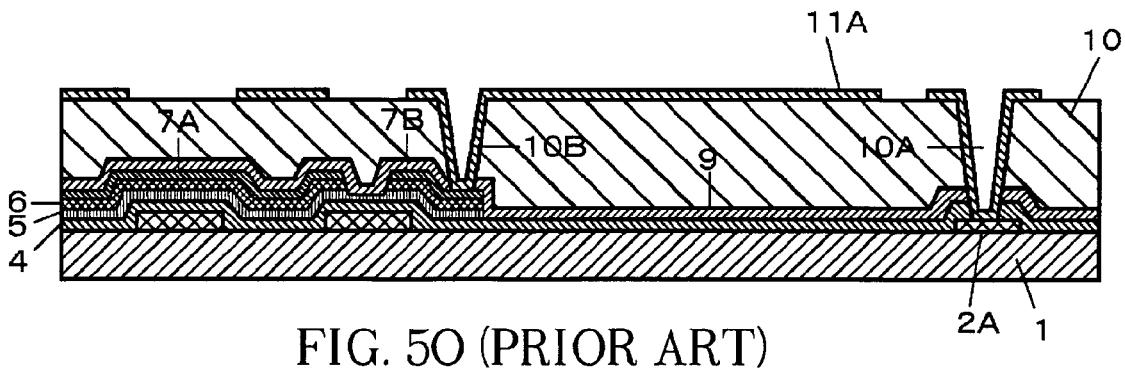

A first nitride silicon film 4 as the gate insulation layer, a first silicon film 5 as channels of transistor, and a second silicon film 6 doped with N-type impurities as shown in FIG. 2D are covered by using the plasma CVD device or sputtering device. Moreover, chromium, molybdenum, tantalum, aluminum, copper, alloy thereof, or stacked layer thereof is covered as a second metal film 7 by using the sputtering device. Afterward, a photoresist pattern 8 as shown in FIG. 2E is prepared by using a second photomask, which adjusts the transmittable exposure energy with slit pattern and dot pattern, or which adjusts the transmittable exposure energy with semi-transmitting film to form an unexposed portion, a fully exposed portion, and a half-tone exposed portion. As shown in FIG. 2F, the second metal film 7, the second silicon film 6, and the first silicon film 5 are etched with the photoresist pattern 8 as a mask, and thereafter the photoresist in the channel section 8A is removed by oxygen plasma ashing method for exposing the data line layer 7, as shown in FIG. 3G. Subsequently, the data line layer 7, the second silicon film 6, and the first silicon film 5 are again etched with the photoresist pattern 8B of reduced film thickness, as shown in FIG. 3H. The first silicon film 5 remains a thickness of around 0.05 to 0.1 μm. Then, as shown in FIG. 3I, the remaining photoresist is removed and a source wiring 7A and a drain wiring 7B are formed.

Figure 6P:
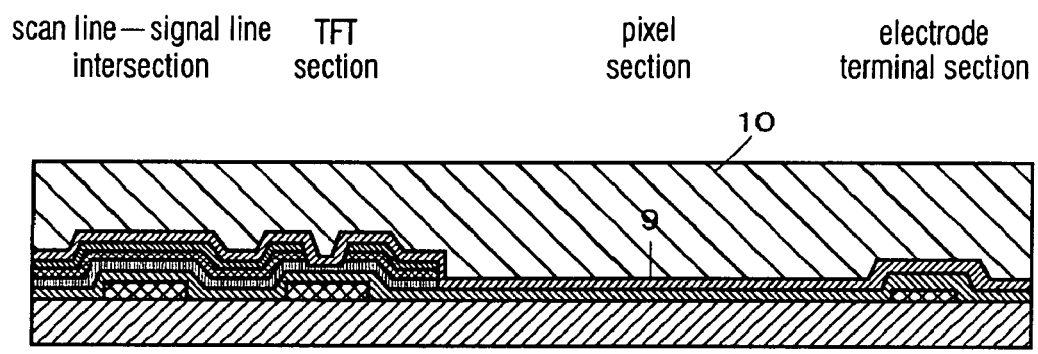
FIGS. 6P, 6Q, and 6R each illustrates a sectional view of an array substrate for LCD according to the invention (contact formation process and pixel electrode formation process).
Figure 7:
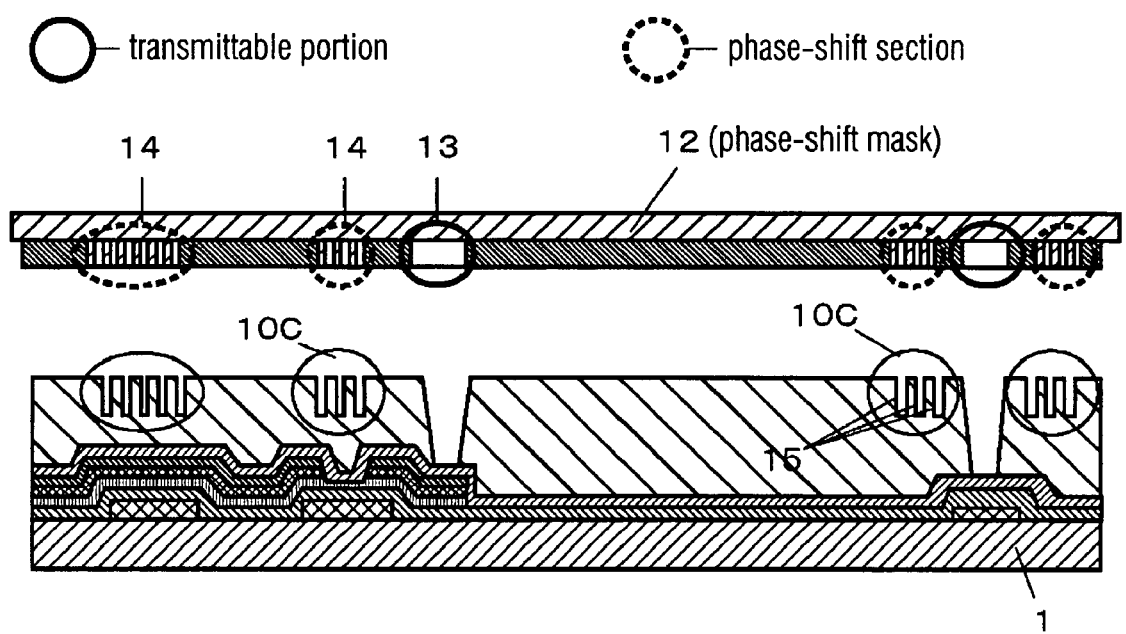
FIG. 7 illustrates a phase-shift mask utilized in the invention.

Next, as shown in FIG. 6P (similar to FIG. 4J), a protection film or a passivation layer 9 like a second silicon nitride film is formed by sputtering or CVD, and a planarization film like a photosensitive acrylic resin film 10 with a thickness of, for example, 3 to 6 μm, is coated thereon.

Figure 6Q:
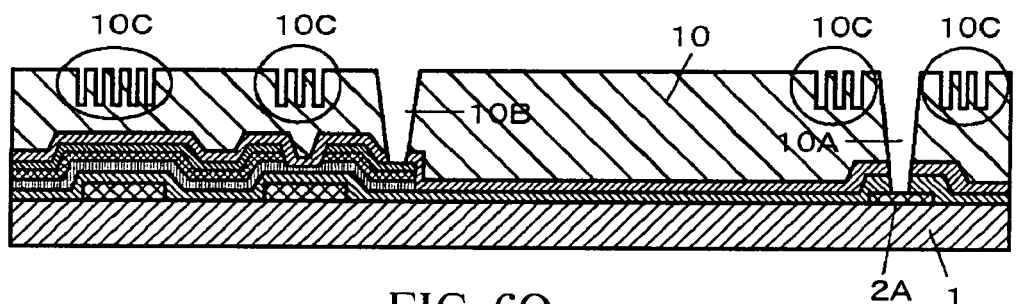

Then, a photosensitive acrylic resin film 10 is patterned with a phase-shift mask 12 as shown in FIG. 7 as a third photomask. As far as the phase-shift mask is concerned, there are, for example, silicon molybdenum films and silicon zirconium films which function as phase shifters, or dig-in type ones which change phase by digging into the photomask substrate used for quartz glass, or chromium-free phase-shift masks, etc. When the phase-shift mask 12 is used, as shown in FIG. 6Q and FIG. 7, a taper pattern required by through holes is formed in the through hole formation regions 10A, 10B by using light from an transmittable portion 13, like general binary masks do. At this time, the openings of the through hole formation regions 10A, 10B reach the surface of the protection film 9. Furthermore, a light shielding area 10C including a portion between pixel electrodes (not shown), a portion between the electrode terminals, a TFT section, and an intersection between a scan line and a data line, also includes phase-shift sections 14, so patterned trenches 15 are formed to be more vertical than the through hole formation region, and it is possible to form the fine patterns with a greater resolution than that of an exposure machine as well. As the trenches 15 have a line width equal to or larger than the resolution of the exposure machine, the energy irradiated on the photosensitive acrylic resin film 10 is less than that on the through hole formation region, hence the bottom of the trenches 15 will not reach the bottom of the photosensitive acrylic resin film 10. For example, a pattern of the phase-shift section 14 can be designed such that the slit width of the trenches 15 is 1 to 3 μm and the depth is about 1 to 4 μm. The phase-shift (phase-shift effect) section 14 is adjusted to emphasize edge sections of the patterns by changing the phase of adjacent patterns. Moreover, although positive-type photosensitive acrylic resin film has been taken as an example in the above description, phase-shift exposure can be applied to chemically amplified negative-type photosensitive acrylic resin films. Then, the second silicon nitride film 9 and the first silicon nitride film 4 are selectively removed by etching with the pattern of the photosensitive acrylic resin film obtained from the phase-shift mask 12 as a mask, as shown in FIG. 6Q.

Figure 6R:
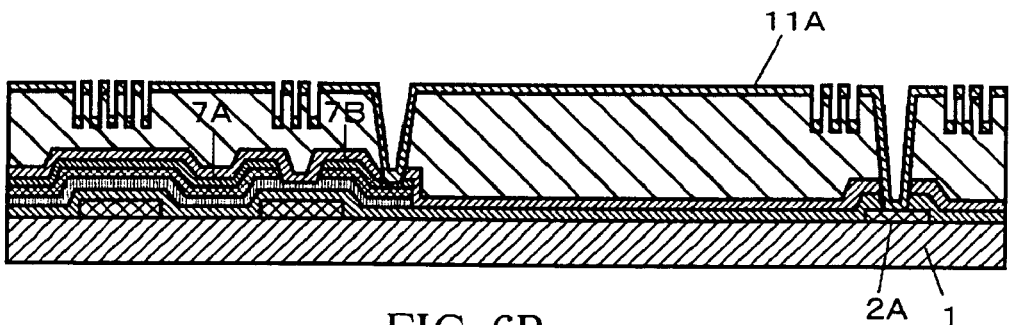

As shown in FIG. 6R, a transparent conductive film 11 of 0.04 to 0.2 μm thickness is covered on the photosensitive acrylic resin film 10 patterned by sputtering or coating. In the case of coating, after the solution including conductive material is coated, the transparent conductive film is heated such that it is physically and chemically stable; the conductive material included in the solution can be ITO, IZO, $IN_2O_3$, ZnO, etc. A transparent conductive film is generally as thick as described above (around 0.1 μm). A transparent and conductive pixel electrode 11A is automatically formed in the pixel electrode formation region by using the deep (more than 0.1 μm) and narrow trenches 15 of the light shielding area 10C formed in the previous step, where the trenches 15 easily separate the transparent conductive film 11 physically and electrically. However, the pixel electrode 11A is physically and electrically coupled to the through hole 10B and the drain 7B of TFT.

Second Embodiment

As understood from the first embodiment, the pixel electrode does not need to be patterned in the invention; rather, the conductive film for the pixel electrode is physically and electrically separated by using the deep trenches 15 formed from the photosensitive acrylic resin film 10. Therefore, when the conductive film of the pixel electrode is composed of metal with high reflectivity, such as aluminum, aluminum alloy, silver, and silver alloy, the pixel electrode (reflective electrode) of a reflective LCD device can be obtained. The thickness of metal film formed by sputtering is the same as the film thickness of a transmission-type transparent electrode, which is generally 0.1 μm. This also means that decrease of reflectivity as the increase of film thickness along with crystal growth is prevented.

Although not shown, the substrate of the pixel electrode of a reflective LCD device is not flat but requires a concave-convex surface with a depth of 0.5 to 1 μm in order to avoid mirror reflection. In most cases, photosensitive acrylic resin film is used in the formation of substrate with concave-convex surface as well, while it also invokes a cost issue. If the concave-convex is formed using the first layer of the photosensitive acrylic resin film, then a so-called final passivation layer is covered to form a second layer of photosensitive acrylic resin film, and the pixel electrode is formed after the opening section for coupling the pixel electrode and the drain is formed. Thus, the reflective LCD device is obtained. In this case, the purpose of decreasing the number of manufacturing process can be achieved if the invention is applied to the second layer of the photosensitive acrylic resin film.

In order to realize the deep trenches and the concave-convex surface as proposed by the invention by using only one layer of photosensitive acrylic resin film, it is presumed that a technology that only partially supplies heat energy and light energy to the concave-convex formation region is in need for development. However, the great cost merit still exists in comparison to the long process treatment which two layers of photosensitive acrylic resin film are used to form the concave-convex surface. The use of only one layer of photosensitive acrylic resin film together with the deep trenches of the invention will benefit the cost down of reflective LCD devices.

As understood from the above descriptions, in the invention, it is unnecessary to use the process of patterning pixel electrode, and so the TFT array substrate of transmission-type LCD devices can be manufactured with three photomasks.

It is to be noted that though the organic layer (acrylic resin film) 10 is a necessary component, whereas the passivation layer or protection film 9 is not necessary for an LCD device including etch-stop insulated gate-type transistor with a protection passivation layer on channels.

What is claimed is:

1. A method for manufacturing a liquid crystal display device, comprising:
    providing a first transparent substrate with a light shielding area, comprising the steps of:
        forming a scan line, a data line, and a transistor on the first transparent substrate, the scan line and the data line being respectively coupled to a gate electrode and a source electrode of the transistor;
        forming a passivation layer over the first transparent substrate;
        forming an organic layer including a through hole and a plurality of trenches on the passivation layer by using a single phase-shift photomask, wherein the through hole extends to the bottom of the passivation layer, and the trenches corresponds to the light shielding area; and
        forming a pixel electrode on the organic layer, the pixel electrode being electrically connected to a drain electrode of the transistor via the through hole and the pixel electrode being physically and electrically separated by the trenches;
    providing a second transparent substrate; and
    forming a liquid crystal layer between the first transparent substrate and the second transparent substrate.

2. The method for manufacturing a liquid crystal display device as recited in claim 1, wherein the plurality of trenches do not reach the bottom of the organic layer.

3. The method for manufacturing a liquid crystal display device as recited in claim 1, wherein the step of forming a pixel electrode is by sputtering ITO, IZO, or mixture thereof.

4. The method for manufacturing a liquid crystal display device as recited in claim 1, wherein the step of forming a pixel electrode is by coating at least one transparent conductive powder of ITO, IZO, $IN_2O_3$, and ZnO.

5. The method for manufacturing a liquid crystal display device as recited in claim 1, wherein the step of forming a pixel electrode is by sputtering a reflective metal selected from the group consisting of aluminum, aluminum alloy, silver, or silver alloy.

* * * * *